(12) United States Patent
Martines et al.

(10) Patent No.: US 7,177,217 B2
(45) Date of Patent: Feb. 13, 2007

(54) METHOD AND CIRCUIT FOR VERIFYING AND EVENTUALLY SUBSTITUTING DEFECTIVE REFERENCE CELLS OF A MEMORY

(75) Inventors: Ignazio Martines, Tremestieri Etneo (IT); Davide Torrisi, Acireale (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 89 days.

(21) Appl. No.: 11/121,615

(22) Filed: May 4, 2005

(65) Prior Publication Data
US 2005/0248982 A1  Nov. 10, 2005

(30) Foreign Application Priority Data
May 4, 2004  (IT)  ............... VA2004A0019

(51) Int. Cl.
*G11C 7/02* (2006.01)
*G11C 11/34* (2006.01)
(52) U.S. Cl. .................. 365/210; 365/185.2
(58) Field of Classification Search ............... 365/210, 365/185.2, 207
See application file for complete search history.

(56) References Cited

U.S. PATENT DOCUMENTS

| | | | | |
|---|---|---|---|---|
| 5,859,796 A | * | 1/1999 | Cleveland | ............ 365/185.2 |
| 5,973,959 A | * | 10/1999 | Gerna et al. | ............ 365/185.03 |
| 6,639,837 B2 | * | 10/2003 | Takano et al. | ............ 365/185.22 |
| 6,801,466 B2 | * | 10/2004 | Giove et al. | ............ 365/207 |
| 6,845,052 B1 | * | 1/2005 | Ho et al. | ............ 365/210 |

* cited by examiner

*Primary Examiner*—Anh Phung
(74) *Attorney, Agent, or Firm*—Lisa K. Jorgenson; Allen, Dyer, Doppelt, Milbrath & Gilchrist, P.A.

(57) ABSTRACT

A circuit verifies and substitutes a defective reference cell of a memory device that includes at least one reference current path including the reference cell and a decoding transistor connected in series. The circuit includes at least one redundant reference current path identical to the at least one reference current path and in parallel therewith. A connection circuit connects in a mutually exclusive way control terminals of the decoding transistor and reference cell of the at least one reference current path to a node or control terminals of the decoding transistor and reference cell of the at least one redundant reference current path to the node. The connecting is based upon a logic signal. A window comparator is coupled to the reference current path for comparing a current therein with a pair of upper and lower thresholds, and outputs the logic signal for the connection circuit based upon the comparison.

14 Claims, 3 Drawing Sheets

METHOD AND CIRCUIT FOR VERIFYING AND EVENTUALLY SUBSTITUTING DEFECTIVE REFERENCE CELLS OF A MEMORY

FIELD OF THE INVENTION

The invention relates in general to semiconductor memory devices, and more particularly, to a method and a circuit for verifying and eventually substituting defective reference cells of a memory device.

BACKGROUND OF THE INVENTION

A memory device comprises an array of cells organized in rows and columns singularly addressable through wordlines and bitlines. Each memory cell may comprise an insulated gate MOSFET including a source terminal connected to ground, a drain terminal connected to a decoding transistor of a respective bitline, and a gate connected to a wordline.

An important field of application of the invention is to non-volatile FLASH memory devices. For this reason, reference will be made to these types of memory devices, although the invention may be applied to semiconductor memory devices in general other than FLASH memory devices.

In FLASH memory devices it may be important to ensure reliability in writing and reading operations for a very large number of cycles. Typically, it is desired to provide reliability for no less than $10^5$ write/erase cycles for each sector of the memory array, and to perform correctly a substantially unlimited number of read cycles. The compactness of memory devices and their number of sectors is constantly increasing, and as a consequence, the cells used as reference in read/verify operations are subject to a particularly intense stress.

As an example, a typical FLASH memory with N sectors carries out $10^5$ write operations for each sector. Let $n_{avg}$ be the average number of times the read and verify operations are carried out for determining whether the write operation has been correctly carried out or not for all the memory locations of each sector. The reference cell is biased in a verification mode for a number of times RCAT (Reference Cell Addressing Time) equal to:

$$RCAT=100K*N*n_{avg}$$

Typically, $n_{avg}=32768$; N=64, 128, 256, . . .

For the considered example, the number of times an internal reference cell is read for the usual verification of write operations is between $10^{11}$–$10^{12}$. Each verify operation implies imposing, on the cell to be verified and on the reference cell, a gate voltage equal to $V_P$ or $V_E$, depending on whether a null or an active stored bit is being verified. The voltage $V_P$ may be about 7V and the voltage $V_E$ may be about 5V. The drain voltage of the cell is typically about 1V, and the body voltage is zero or negative (−1V) while the source terminal is typically grounded.

This huge number of read operations implies a stress that may lead to a soft-cancellation or soft-programming of the reference cells used in the read operations. These phenomena are caused by a drift of the I-V characteristic of the reference cell, as shown in FIG. 1, from the desired voltage-current characteristics. The desired voltage-current characteristics are designed for obtaining the best performance in terms of time required for programming, and correctly performing the read operations on a memory cell.

To counter the problem, the RCAT factor is reduced by forming a plurality of reference cells, each used for reading only a certain subset of memory cells, thus proportionally reducing it. Increasing the number of banks of the memory array has the following penalties and drawbacks.

Silicon area occupation: each bank of reference cells has a non-negligible silicon area requirement. This is mainly because, besides the dedicated reference cells, dummy cells are also necessary for making the reference cells electrical behavior as similar as possible to that of the programmable array cells. Generally, the occupied silicon area is proportional to the number of banks of the memory array.

Programming time: the reference cells should be programmed during the EWS step (Electrical Wafer Sorting) and commonly one bank at the time is programmed. Generally, it is not possible to program more banks in parallel because of intrinsic problems of common memory architectures. The verify time relative to the programming of reference cells of each bank is not negligible. Increasing the number of banks of cells to be programmed increases the die testing time.

This is even more evident considering that during the EWS phase, a reference cell is programmed by gradually increasing, step after step, the threshold voltage thereof, until the condition in which the design current $I_{RIF}$ flows through the cell when the gate voltage $V_{TH-RIF}$ is reached, as shown in FIG. 2.

SUMMARY OF THE INVENTION

In view of the foregoing background, an object of the invention is to provide a circuit that reduces the above mentioned problems and permits a reduction of the occupied silicon area.

This and other objects, advantages and features in accordance with the invention are provided by a reference current path comprising a reference cell in series to a decoding transistor, and if the reference current path is found defective, it is substituted with an identical redundant reference path. Duplicating the reference current path within a same bank of reference cells has advantages over the known approach of duplicating a bank of reference cells.

The number of reference cells that are effectively used during read operations as well as the number of necessary dummy cells may remain unchanged. In contrast, according to the prior art approach of increasing the number of banks, the arrays of reference cells are necessarily replicated, thus it is also necessary to replicate the array dummy cells with a resulting increase in the silicon area.

Moreover, according to the invention, all reference cells are grouped in a single array of reference cells, thus the time for programming them during the EWS phase is not increased.

More precisely, the circuit verifies and substitutes defective reference cells of a semiconductor memory having at least a reference current path including a reference cell in series to a decoding transistor, wherein defective reference cells can be substituted. The circuit may comprise at least a second reference current path identical to the first one and in parallel thereto, and a connection circuit or circuit means for connecting in a mutually exclusive way to a node at a pre-established voltage the control nodes of the decoding transistors and of the reference cells of the first and second electrical paths, depending on the state of a logic signal. A window comparator may be coupled to the first electrical reference path for comparing the current flowing in the first electrical path with a pair of upper and lower thresholds. The window comparator outputs the logic signal in an active state when the current is within the thresholds.

Another aspect of the invention is directed to a method for verifying and substituting the defective reference cells of a semiconductor memory.

BRIEF DESCRIPTION OF THE DRAWINGS

The invention is described while referring to the attached drawings, in which.

DETAILED DESCRIPTION OF THE PREFERRED EMBODIMENTS

Figure 1:
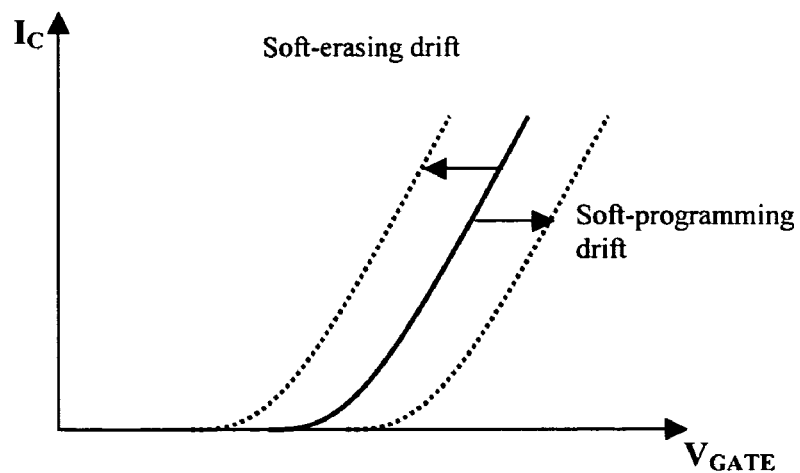
FIG. 1 is a graph illustrating voltage-current characteristics of a reference cell according to the prior art.
Figure 2:
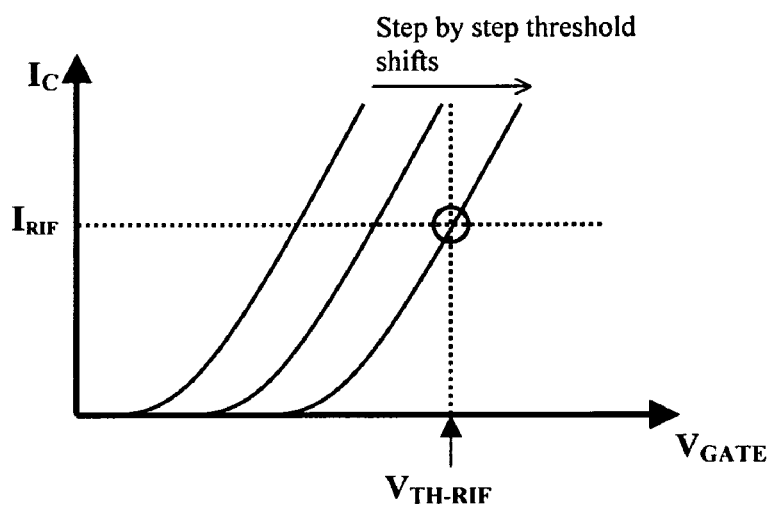
FIG. 2 is a graph illustrating successive displacements of the characteristic of a reference cell carried out in an EWS phase according to the prior art.
Figure 3:
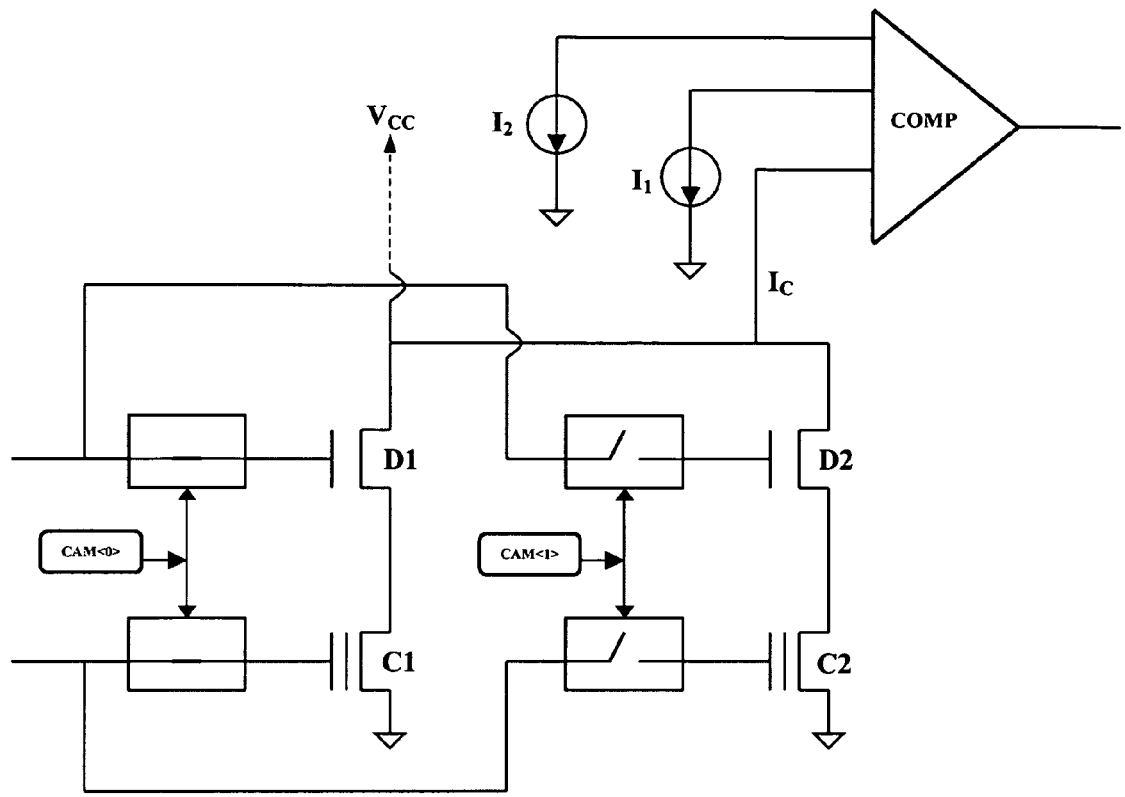
FIG. 3 is a schematic diagram of the circuit connected to a reference path according to the invention.

A basic scheme according to the preferred embodiment of a verification/substitution circuit of the invention, relative to a reference current path D1 and C1, is depicted in FIG. 3. The reference current path includes a decoding transistor D1 and a cell C1 connected in series to each other. The transistor D1 and the cell C1 are generally depicted for illustrative purposes as an insulated gate MOSFET. The verification/substitution circuit further comprises a second (redundant) reference current path D2, C2. The second reference current path is identical to the first reference current path, and is substituted for the first reference current path when for any reason the current $I_C$ absorbed by the first reference current path is no longer in a pre-established design range $[I_1, I_2]$.

The circuit includes a window comparator that compares the current $I_C$ flowing in the reference current path D1, C1 with a pair of pre-established thresholds $I_1, I_2$. The window comparator outputs a logic comparison signal based upon the comparison.

The control terminals of the decoding transistors and of the reference cells of both current paths are coupled to a same node at a predefined design voltage through pass-gates controlled by programmable registers CAM<0> and CAM<1>. Only one of these registers is programmed by a dedicated circuit (not depicted in the figure) such that only one of the two reference current paths is enabled.

The number of reference cells being used for read operations is not increased, thus it is not necessary to increase the number of dummy cells besides those normally present in the bank of reference cells. Indeed, if a reference cell is found defective, it is substituted with an identical cell that uses the same dummy cells that were used before by the disabled defective cell.

To better understand how the circuit functions, a single reference current path is being duplicated for the sake of simplicity. Of course, the same considerations apply to the case in which there is more than one reference path available for substituting each reference current path.

According to the method of the invention, at the turning on of the memory device or during any write cycle, it is verified whether the current $I_C$ absorbed by the reference cell C1, at the pre-established gate voltage $V_{TH-RIF}$, is in a pre-established range $[I_1, I_2]$ containing the reference current level $I_{RIF}$. If, at the voltage $V_{TH-RIF}$, the absorbed current is not in this interval, then the non-volatile register CAM<1> is programmed and the register CAM<0> is reset so that the defective reference path C1, D1 is disabled and the path C2, D2 is used for read and write operations for a memory cell.

Figure 5:
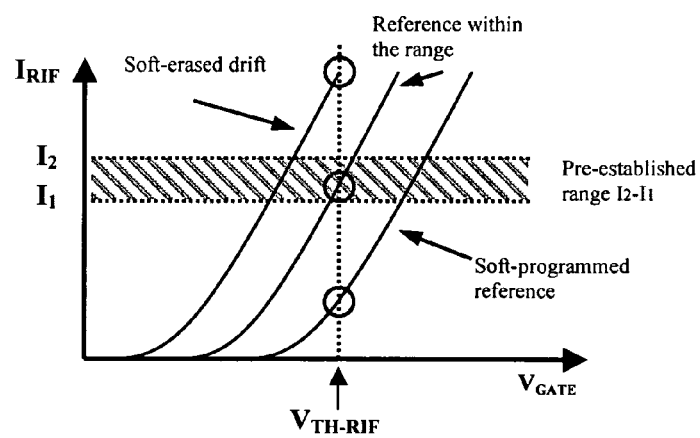
FIG. 5 is a graph comparing voltage-current characteristics of two defective cells with those of a good cell according to the invention.
Figure 4:
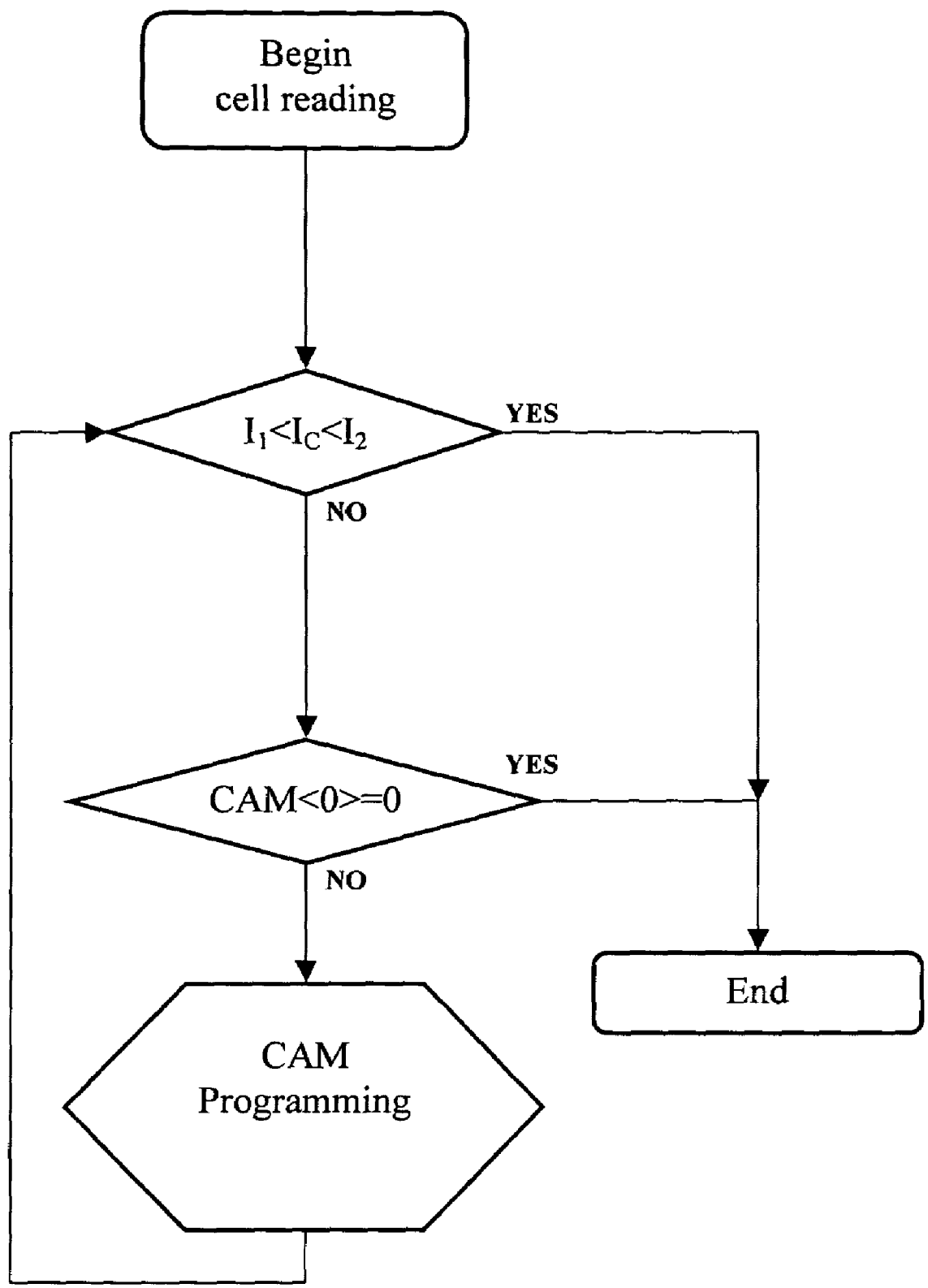
FIG. 4 is a flow-chart of the method according to the invention.

A flow chart of this method for substituting defective reference cells at the turning on of the memory device, preferably at the end of the power-on phase, is shown in FIG. 4. A memory cell is read after the supply voltage $V_{cc}$ has reached a stable value and at the same time the current absorbed by the reference cell is compared with a pair of upper $I_2$ and lower $I_1$ thresholds. If the current of the reference cell is inside the pre-established interval $[I_1, I_2]$ depicted in FIG. 5, no substitution is effected. In contrast, if a reference cell (C1) current is found to be outside this range, the reference cell C1 is substituted by programming the register CAM<1> and resetting the register CAM<0>. The gates of the defective reference cell C1 and of the relative decoding transistor D1 remain isolated while the gates of the cell C2 and of the transistor D2 are connected to the node at the voltage $V_{TH-RIF}$.

Should the power-on phase fail, the verification of the reference cells, and eventually the programming of the CAM registers, are aborted. Such occurrences will not cause any problem because defective reference cells, if any, will be substituted at the successive power-on phase of the memory device.

The invention claimed is:

1. A circuit for verifying and substituting a defective reference cell of a memory device comprising at least one reference current path including the reference cell and a decoding transistor connected in series, the reference cell and the decoding transistor each comprising a control terminal, the circuit comprising:
   at least one redundant reference current path identical to the at least one reference current path and in parallel therewith;
   a connection circuit for connecting in a mutually exclusive way the control terminals of the decoding transistor and reference cell of the at least one reference current path to a node having a pre-established voltage or the control terminals of the decoding transistor and reference cell of said at least one redundant reference current path to the node having the pre-established voltage, the connecting being based upon a logic signal; and
   a window comparator coupled to the at least one reference current path for comparing a current therein with a pair of upper and lower thresholds, and outputting the logic signal for said connection circuit based upon the comparison.

2. A circuit according to claim 1, wherein said connection circuit comprises:
   a first plurality of pass-gates for selectively coupling the control terminals of said decoding transistor and the reference cell in the at least one reference current path to the node having the pre-established voltage; and
   a second plurality of pass-gates for selectively coupling the control terminals of said decoding transistor and said reference cell in said at least one redundant reference current path to the node having the pre-established voltage.

3. A circuit according to claim 2, wherein said connection circuit further comprises:
   a first non-volatile register for setting said first plurality of pass-gates in a conducting state when programmed or in a non-conducting state when reset; and
   a second non-volatile register for setting said second plurality of pass-gates in a conducting state when programmed or in a non-conducting state when reset.

4. A circuit according to claim 3, wherein said connection circuit further comprises:
   a program circuit for programming in a mutually exclusive way said first and second non-volatile registers in response to the logic signal output by said comparator;
   the programming being performed so that only one of said first and second non-volatile registers is programmed at a time with the other non-volatile register being reset.

5. A memory device comprising:
   a plurality of non-volatile memory cells;
   a plurality of reference cells and a plurality of decoding transistors associated with said plurality of non-volatile memory cells, each reference cell connected in series with a corresponding decoding transistor, and each reference cell and decoding transistor comprising a control terminal;
   a plurality of reference current paths, each reference current path connected to a respective reference cell and the corresponding decoding transistor;
   at least one verification/substitution circuit for verifying and substituting a defective reference cell comprising
      a redundant reference current path identical to said reference current path and in parallel therewith,
      a connection circuit for connecting in a mutually exclusive way the control terminals of the decoding transistor and reference cell of said reference current path to a node or the control terminals of the decoding transistor and reference cell of said redundant reference current path to the node, the connecting being based upon a logic signal, and
      a window comparator coupled to said reference current path for comparing a current therein with a pair of upper and lower thresholds, and outputting the logic signal for said connection circuit based upon the comparison.

6. A memory according to claim 5, wherein said connection circuit comprises:
   a first plurality of pass-gates for selectively coupling the control terminals of said decoding transistor and said reference cell in said reference current path to the node; and
   a second plurality of pass-gates for selectively coupling the control terminals of said decoding transistor and said reference cell in said redundant reference current path to the node.

7. A memory according to claim 6, wherein said connection circuit further comprises:
   a first non-volatile register for setting said first plurality of pass-gates in a conducting state when programmed or in a non-conducting state when reset; and
   a second non-volatile register for setting said second plurality of pass-gates in a conducting state when programmed or in a non-conducting state when reset.

8. A memory according to claim 7, wherein said connection circuit further comprises:
   a program circuit for programming in a mutually exclusive way said first and second non-volatile registers in response to the logic signal output by said comparator;
   the programming being performed so that only one of said first and second non-volatile registers is programmed at a time with the other non-volatile register being reset.

9. A method for verifying and substituting a defective reference cell of a memory device comprising at least one reference current path including the reference cell and a decoding transistor connected in series, and at least one redundant reference current path identical to the at least one reference current path and in parallel therewith, the reference cell and the decoding transistor each comprising a control terminal, the method comprising:
   connecting in a mutually exclusive way the control terminals of the decoding transistor and reference cell of the at least one reference current path to a node or the control terminals of the decoding transistor and reference cell of the at least one redundant reference current path to the node, the connecting being based upon a logic signal; and
   comparing a current in the at least one reference current path with a pair of upper and lower thresholds, and outputting the logic signal for the connecting based upon the comparing.

10. A method according to claim 9, wherein the connecting is performed by a connection circuit comprising:
    a first plurality of pass-gates for selectively coupling the control terminals of the decoding transistor and the reference cell in the at least one reference current path to the node; and
    a second plurality of pass-gates for selectively coupling the control terminals of the decoding transistor and the reference cell in the at least one redundant reference current path to the node.

11. A method according to claim 10, wherein the connection circuit further comprises:
    a first non-volatile register for setting the first plurality of pass-gates in a conducting state when programmed or in a non-conducting state when reset; and
    a second non-volatile register for setting the second plurality of pass-gates in a conducting state when programmed or in a non-conducting state when reset.

12. A method according to claim 11, wherein the connection circuit further comprises:
    a program circuit for programming in a mutually exclusive way the first and second non-volatile registers in response to the logic signal;
    the programming being performed so that only one of the first and second non-volatile registers is programmed at a time with the other non-volatile register being reset.

13. A method according to claim 9, wherein the connecting and comparing are performed when the memory is turned on.

14. A method according to claim 9, wherein the connecting and comparing are performed during a write operation of the memory.

* * * * *